United States Patent [19]

Wako

[11] 4,076,370

[45] Feb. 28, 1978

[54] OPTICAL MEMORY HAVING SERIALLY STOCKED HOLOGRAM PLATES

[75] Inventor: Shoji Wako, Ebina, Japan

[73] Assignee: Xerox Corporation, Stamford, Conn.

[21] Appl. No.: 650,226

[22] Filed: Jan. 19, 1976

[30] Foreign Application Priority Data

Jan. 24, 1975   Japan .................................. 50-9808

[51] Int. Cl.² .............................................. G03H 1/30
[52] U.S. Cl. ............................. 350/3.75; 340/173 LT;
350/DIG. 2; 350/150
[58] Field of Search ................... 350/3.5, DIG. 2, 150;
340/173 LT, 173 LM

[56] References Cited

U.S. PATENT DOCUMENTS

| 3,499,700 | 3/1970 | Harris et al. ................... 350/DIG. 2 |
| 3,635,538 | 1/1972 | Caulfield et al. ...................... 350/3.5 |
| 3,868,655 | 2/1975 | Filippazzi ...................... 340/173 LM |

OTHER PUBLICATIONS

Tait, *IBM Technical Disclosure Bulletin,* vol. 11, No. 11, p. 1391, Apr. 1969.
Tait, *IBM Technical Disclosure Bulletin,* vol. 11, No. 12, p. 1636, May 1969.
Pohl, *Applied Optics,* vol. 13, No. 2, Feb. 1974, pp. 341-346.

*Primary Examiner*—Ronald J. Stern
*Attorney, Agent, or Firm*—James J. Ralabate; Franklyn C. Weiss; Allen S. Melser

[57] ABSTRACT

An optical holographic memory device wherein a plurality of hologram plates, each plate comprising an array of sub-holograms, are arranged in a predetermined horizontally registered relation to one another, the amount of information recorded on the plates thereby not being restricted by the light deflecting device utilized to read a selected sub-hologram.

6 Claims, 4 Drawing Figures

OPTICAL MEMORY HAVING SERIALLY STOCKED HOLOGRAM PLATES

BACKGROUND OF THE INVENTION

The use of holograms to store optical information has been well documented in the prior art. In general, an array of holograms, or sub-holograms, are holographically formed on a photographic plate and a deflection system is used to deflect a reference beam so that it passes through a selected one of the sub-holograms. The stored information on each sub-hologram can be individually reproduced by well known techniques.

Although the prior art has succeeded in increasing the packing density of information which can be recorded on holographic plates, the readout rate of such information has been limited by both the low precision of the light deflection device utilized and the size of the holographic plate. In particular, the amount of information which can be recorded on the holographic plates is restricted by the deflection angle characteristics of the readout scanning light beam and the size of the holographic plates, effectively limiting the information capacity of a holographic memory.

SUMMARY OF THE PRESENT INVENTION

The present invention provides an optical holographic memory device wherein a plurality of hologram plates, each plate comprising an array of sub-holograms, is arranged in a predetermined horizontally registered relation to one another, the amount of information recorded on the plates thereby not being restricted by the light deflecting device utilized to read a selected sub-hologram.

It is an object of the present invention to provide a holographic memory device wherein readout of information stored therein at high rates is achieved.

It is a further object of the present invention to provide an optical holographic memory device wherein large amounts of information stored therein is read at high rates, the memory device comprising a plurality of hologram plates arranged in horizontally registered relation to one another.

It is still a further object of the present invention to provide an optical holographic memory device wherein large amounts of information stored therein is read at high rates, the memory device comprising a plurality of hologram plates arranged in horizontally registered relation to one another, the packing density of the information stored being independent both of the deflection angle characteristics of the scanning light beam and the size of the hologram plate.

DESCRIPTION OF THE DRAWINGS

For a better understanding of the invention as well as other objects and further features thereof, reference is made to the following description which is to be read in conjunction with the following drawings wherein.

DESCRIPTION OF THE PREFERRED EMBODIMENT

Figure 1:
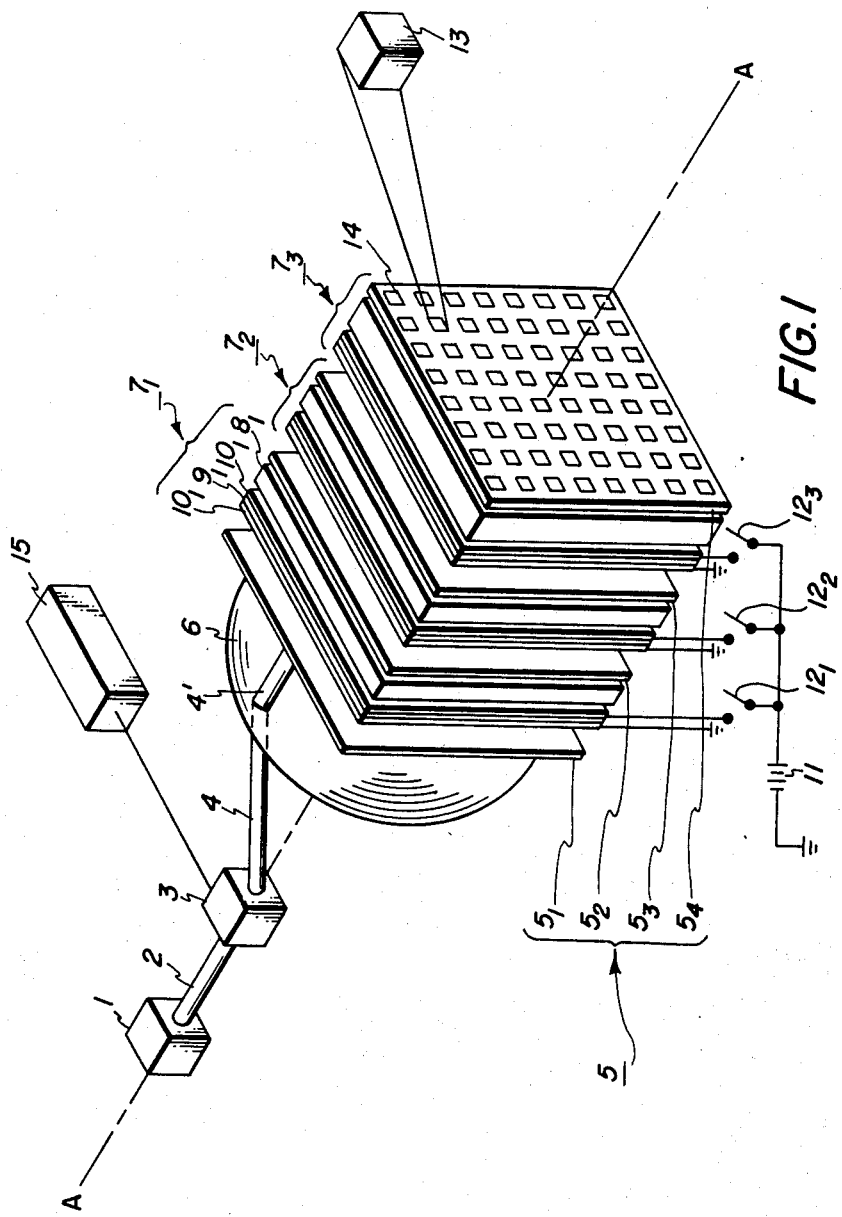
FIG. 1 is a perspective view of the holographic memory device of the present invention.

Referring now to FIG. 1, a light beam emitter 1 emits a light beam 2 having an interference characteristic. In the preferred embodiment, light emitter 1 comprises a laser. The light beam 2 from light beam emitter 1 is deflected by deflecting means 3, deflected light beam 4 irradiating a plurality of hologram plates, represented by reference numeral 5 in the figure, via a lens 6 disposed in front of the hologram plates. The lens 6 serves to refract the light beam 4 deflected by light deflecting means 3 to provide a light beam 4' parallel with the axis A—A, light beam 4' having passed through lens 6 irradiating selected portions of the plurality of hologram plates 5. The plurality of hologram plates 5 comprises, for example, four plates $5_1$, $5_2$, $5_3$ and $5_4$ which are arranged in horizontally registered relation to one another, with light beam deflectors $7_1$, $7_2$ and $7_3$ interposed between respective hologram plates $5_1$ through $5_4$. Each light beam deflector $7_1$ through $7_3$ comprises a birefringent crystal 8 and an electrooptical crystal 9, on the opposite surface of which transparent electrodes 10 are disposed. A typical electrooptical crystal may comprise lithium tantalate $LiTaO_3$. The anode side of a power source 11 is connected through switches $12_1$, $12_2$ and $12_3$ to the transparent electrodes 10 near the birefringent crystals 8 in each light beam deflector 7, and the other transparent electrodes 10 are respectively connected to the cathode side of the power source 11. Provided rearwards of the group of hologram plates 5 is a detecting element 13, which detects reproduced images due to irradiation thereof by light beams containing information, the light beams having passed through selected sub-holograms 14 recorded on hologram plates $5_1$ through $5_4$. The detecting element 13 is shown in FIG. 1 reading a specific subhologram 14 of hologram plate $5_4$. The detecting element 13 may be part of an array in which each element is positioned to read a specific sub-hologram on any of the hologram plates $5_1 - 5_4$. The position of each element is determined by the angle of diffraction when the reconstructed image beam is generated by diffraction at the sub-hologram of interest. In the alternative, the detecting element 13 may be relocated by conventional means not shown to read a selected sub-hologram on any of the hologram plates $5_1 - 5_4$. Processing means 15 is provided to cause the deflected beam 4 to irradiate a selected sub-hologram 14 on hologram plates $5_1$, $5_2$, $5_3$ or $5_4$. Processing means 15 memorizes the address of the sub-hologram 14 for which readout is desired and causes the beam to deflect to and scan the desired sub-hologram. The processing means 15 embodies known techniques and the details thereof have not been set forth.

Figure 2A:
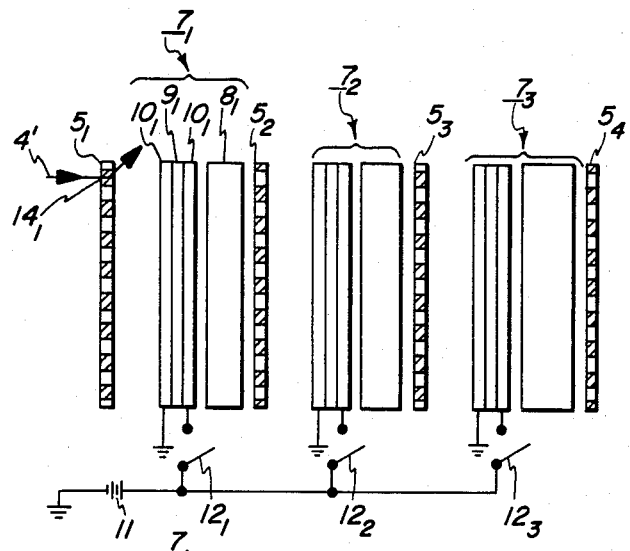
FIGS. 2(a) through 2(c) illustrate the selection of a particular hologram plate for readout.
Figure 2B:
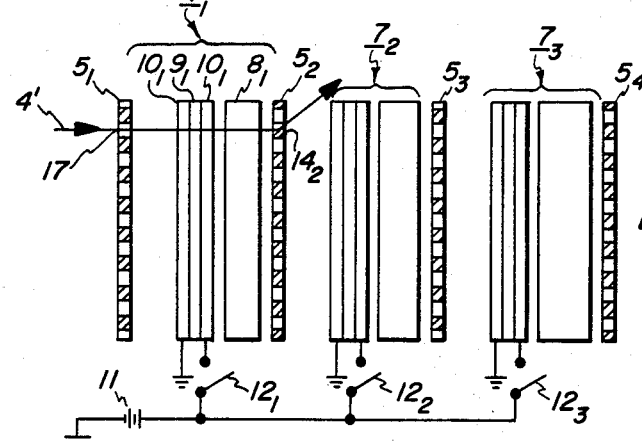
Figure 2C:
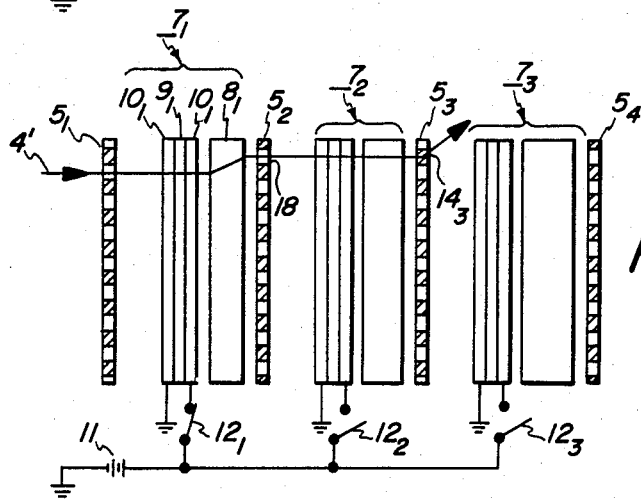

In operation, to read the information recorded on the hologram plate $5_1$ located in the foremost position with respect to the lens 6, light beam 4' (FIG. 2(a)) is irradiated by way of deflecting means 3 on the subhologram selected on plate $5_1$. The beam 4' irradiating sub-hologram $14_1$ is diffracted to detecting element 13 for readout after passing through the sub-hologram using standard optical techniques. To read the information recorded on the hologram plate $5_2$ in the second position, light beam 4' is caused to pass through a transparent portion 17 of the first hologram plate $5_1$ other than information recorded portions (i.e. sub-holograms 14) and then irradiated on sub-hologram $14_2$ on the second hologram plate $5_2$ (FIG. 2(b)), the light diffracted therefrom being read by detecting element 13. To read the information recorded on the third halogram plate $5_3$, current is supplied by way of the switch $12_1$ to the transparent electrode 10 of the light beam deflector $7_1$ interposed between the first and second hologram plates $5_1$ and $5_2$, the electric field applied by source 11 causing the plane of polarization of the incident beam to rotate. When the polarization plane-rotated light beam 4' passes through the light beam deflector crystal 8, the light beam is refracted so as to be irradiated on a transparent portion 18 on the second hologram plate $5_2$ so that the light beam will be irradiated on the sub-hologram $14_3$ on the hologram plate $5_3$ (FIG. 2(c)), the information recorded on the hologram plate $5_3$ as contained in the light beam passing therethrough being read by detector 13. The information recorded on the fourth hologram plate $5_4$ may be read by means of light detecting element 13 by closing switches $12_2$ or $12_3$. In this case, the birefringent crystal 8 may be physically rotated, so that the deflected light due to the electro-optical crystal 9 disposed in the preceding position will not affect the beam position. Alternately, the switch circuit 12 may be controlled so that the light deflected in the preceding stage may be returned to the normal position, as is commonly practiced in the known light deflecting device, switches $12_2$ or $12_3$ thereby determining the subsequent beam position.

It should be noted that the switches $12_1$, $12_2$ and $12_3$ may be manually operated or automatically controlled (by means not shown) in conjunction with processing means 15 to position the scanning light beam 4' at the desired sub-hologram on hologram plates $5_2$, $5_3$ or $5_4$.

According to the present invention, the information is read from the plurality of hologram plates arranged in horizontally registered relation to each other, such that by the use of a light deflecting device whose precision in performance is as low as being capable of selecting only the sub-hologram on the hologram plate assuming the frontmost position, (i.e. hologram plate $5_1$), switch means are provided for the selection of sub-holograms on succeeding hologram plates. Therefore, a large information capacity may be read at a high rate. Thus, an optical memory device which is capable of utilizing to the fullest extent hologram plates on which a large capacity of information can be recorded at a high packing density is provided, the memory being comparatively simple in construction and economically advantageous.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. An optical memory device comprising:
   means for generating a scanning light beam,
   a first hologram plate adjacent said generating means and transparent except for an array of sub-holograms arranged in spaced relationship on said plate,
   means for positioning said scanning light beam to irradiate a selected portion of said first hologram plate;
   a second hologram plate adjacent said first hologram plate and transparent except for an array of sub-holograms arranged in spaced relationship on said plate, said first and second hologram plates being arranged in serial alignment in the direction of light propagation of said scanning light beam and in a horizontally registered relation to one another,
   a light beam deflector interposed between said first and second hologram plates,
   means coupled to said light beam deflector for causing the scanning light beam which is transmitted through a selected transparent portion of said first hologram plate to be deflected by said light beam deflector so the scanning light beam irradiates a selected portion of said second hologram plate, and
   detecting means for reading a selected one of said sub-holograms irradiated by said scanning light beam.

2. The device as defined in claim 1 wherein said light beam deflector comprises a birefringent crystal adjacent an electro-optical crystal, said electro-optical crystal having transparent electrodes disposed on the opposite surfaces thereof.

3. The device as defined in claim 2 wherein said causing means comprises a voltage source coupled between said transparent electrodes.

4. The device as defined in claim 3 wherein said causing means is operatively associated with said positioning means whereby a selected sub-hologram on said second hologram plate is irradiated.

5. The device as defined in claim 1 wherein said generating means comprises a laser.

6. The device as defined in claim 1 further including a third hologram plate positioned adjacent said second hologram plate and transparent except for an array of sub-holograms arranged in spaced relationship on said plate and a light beam deflector interposed between said second and third hologram plates, the scanning light beam transmitted through a selected transparent portion of said second hologram plate irradiating a selected portion of said third hologram plate.

* * * * *